United States Patent [19]

Onuki et al.

[11] Patent Number: 5,153,704
[45] Date of Patent: Oct. 6, 1992

[54] SEMICONDUCTOR DEVICE USING ANNEALED BONDING WIRE

[75] Inventors: Jin Onuki, Hitachi; Masateru Suwa, Toukai; Masahiro Koizumi, Hitachi; Tomio Iizuka, Toukai; Takeo Tamamura, Hitachi, all of Japan

[73] Assignee: Hitachi, Ltd., Tokyo, Japan

[21] Appl. No.: 818,457

[22] Filed: Jan. 3, 1992

Related U.S. Application Data

[63] Continuation of Ser. No. 581,125, Sep. 10, 1990, which is a continuation of Ser. No. 74,151, Jul. 16, 1987, abandoned, which is a continuation of Ser. No. 473,715, Mar. 9, 1983, abandoned.

[30] Foreign Application Priority Data

Mar. 10, 1982 [JP] Japan ................. 57-36468

[51] Int. Cl.$^5$ .................. H01L 23/28; H01L 23/50
[52] U.S. Cl. ..................... 357/65; 357/72; 228/179; 228/180.2; 228/204; 428/606
[58] Field of Search ............ 357/72, 65; 228/179, 228/180.2, 204; 428/606; 148/12.7 A, 11.5 C

[56] References Cited

U.S. PATENT DOCUMENTS

| | | | |
|---|---|---|---|
| 3,357,090 | 12/1967 | Tiffany | 357/72 |
| 3,383,757 | 5/1968 | Baker et al. | 357/65 |
| 3,430,835 | 3/1969 | Grable et al. | 357/65 |
| 3,492,547 | 1/1970 | Recko et al. | 357/72 |
| 3,623,649 | 11/1971 | Keisling | 357/65 |
| 3,827,917 | 8/1974 | Zeigler et al. | 148/12.7 A |
| 3,838,240 | 9/1974 | Schelhorn | 219/85 |
| 3,842,492 | 10/1974 | Kamerbeck | 357/72 |
| 4,080,485 | 3/1978 | Bonkohara | 357/65 |
| 4,082,573 | 4/1978 | Schoerner et al. | 148/12.7 A |
| 4,121,951 | 10/1978 | Fortin et al. | 148/12.7 A |
| 4,141,029 | 2/1979 | Dromsky | 357/72 |
| 4,148,671 | 4/1979 | Morris et al. | 148/12.7 A |
| 4,213,556 | 7/1980 | Persson et al. | 228/104 |

FOREIGN PATENT DOCUMENTS

| | | |
|---|---|---|
| 0043692 | 1/1982 | European Pat. Off. |
| 2063196 | 6/1971 | France |
| 57-12531 | 1/1982 | Japan |
| 621667 | 2/1981 | Switzerland |
| 2055508 | 3/1981 | United Kingdom |

OTHER PUBLICATIONS

*Semiconductor Industry Bonding Handbook*, Precision 1977, Small Precision Tools, Inc.
Patent Abstracts of Japan, vol. 6, No. 72, (E-105) (950), May 7, 1982 & JP-A-57 12531, (Fujitsu K.K.), Jan. 22, 1982.

Primary Examiner—Jerome Jackson, Jr.
Attorney, Agent, or Firm—Antonelli, Terry, Stout & Kraus

[57] ABSTRACT

A resin encapsulated semiconductor device comprises a semiconductor element, a conductive base, a wire of aluminum connecting the element and the base, and a thermosetting resin encapsulating hermetically the component to protect the device from a mechanical stress and ambient atmosphere.

22 Claims, 3 Drawing Sheets

SEMICONDUCTOR DEVICE USING ANNEALED BONDING WIRE

This application is a continuation of application Ser. No. 581,125, filed Sep. 10, 1990, which is a continuation of application of Ser. No. 074,151, filed Jul. 16,1987 (now abandoned), which is a continuation of application Ser. No. 473,715, filed Mar. 9, 1983 (now abandoned).

FIELD OF THE INVENTION

The present invention relates to a novel semiconductor device and to the manufacture of a bonding wire employed therefor, and more particularly, to a resin encapsulated semiconductor device having a semiconductor element ball-bonded with an annealed bonding wire.

BACKGROUND OF THE INVENTION

In resin encapsulated semiconductor devices (IC, LSI and transistor), Au wire with a diameter of 20-50 μm is largely employed for providing an electrical connection between a semiconductor element and an external lead frame of a package. In bonding of the wire to the semiconductor element, there are two methods; one is a wedge bonding method and the other is a ball bonding method. These bonding methods are effected in such a way that one end of the Au wire or a ball (formed at an end of the Au wire through fusion thereof by means of arc discharge or hydrogen flames) is bonded to the semiconductor element directly or through a metallic deposited film by means of thermocompression bonding or ultrasonic bonding. On the other hand, the connection of the wire to the lead frame is effected by wedge bonding through a capillary.

However, instead of Au wire, the use of Al wire has been studied, since Au wire is expensive. Also in bonding of Al wire, wedge bonding by means of thermocompression bonding or ultrasonic bonding has been investigated. However, the conventional Al wire, is used just as the wire is drawn, so that the wire material retains hardness due to the drawing operation. The inventors have found that in either the thermo-compression bonding or ultrasonic bonding of Al wire, a part of the wire near the bonding portion is heated and caused to soften, so that a local deformation takes place at the bonding portion in the wire connection from the semiconductor element to the lead frame, and that such a local deformation not only causes the wire to be locally reduced in diameter but also may result in breakage or the like.

Moreover, the inventors have discovered upon examination of the ball bonding of Al wire that since the conventional Al wire is wound on a reel (as it is being drawn as described above), the wire is elastically bent when a ball is formed at its end and the ball is eccentrically formed, and that since when the ball is formed, not only the end of the wire, but also a portion in the vincinity thereof are heated, the wire is partially subjected to annealing, and consequently, the wire is softened directly above the ball or locally constricted.

Furthermore, the inventors have found that the eccentricity of the ball may cause the bonding portion to project from a pad, bringing about short-circuiting with another bonding portion or damage to the circuit.

In addition, the inventors have discovered that if a constriction is produced directly above the ball or if the wire is caused to soften, the residual work set of the wire prevents the wire and the bonding portion from following a fine curve since the portion of the wire not annealed remains in a work-hardened condition; consequently, the wire is bonded in a bent shape, and this may cause breakage of wire. Particularly, in a dual in-line type IC or LSI having a difference in levels between the bonding surfaces of a semiconductor element and a lead frame, this may largely cause a short-circuit between the wire and the semiconductor element.

In case of ceramic packaged semiconductor devices, only a mechanical stress is applied to the bonding portion, since in the ceramic package the wire is not constricted by the package. On the other hand, in the resin encapsulated semiconductor devices a large mechanical stress is applied to the wire because it is rigidly molded with thermosetting resins such as epoxy resins, phenol resins, polyester resins, etc. The mechanical stress at the bonding portion on the semiconductor chip is maximum. Thereafter, it has been found that in resin encapsulated semiconductor devices, the wire materials play a very important role in the production of satisfactory ball-bonded connections.

SUMMARY OF THE INVENTION

It is an object to provide a packaged semiconductor device electrically connected by means of a wire having less local deformation.

The present invention comprises a packaged semiconductor device having at least one semiconductor element electrically connected together through a wire of small diameter by means of solid-state bonding; i.e., fusion bonding as during ball-bonding or wedge-bonding, wherein the wire is made of a metal having, in the annealed state, an elongation at room temperatures of not more than 60% and the wire is previously annealed. The advantages of the present invention are evident in ceramic packaged semiconductor devices and are especially noteworthy in resin encapsulated semiconductor devices.

DETAILED DESCRIPTION OF PREFERRED EMBODIMENTS

Figure 1:
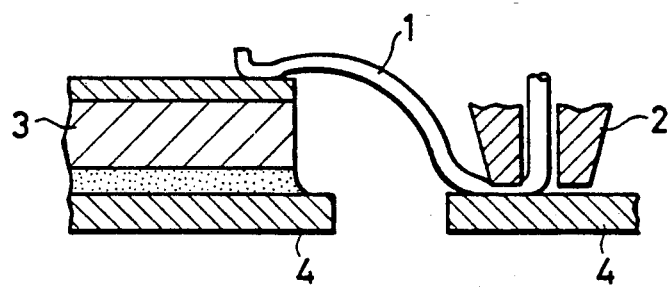
FIG. 1 is a sectional view of a semiconductor device wedge-bonded by employing a conventional wire.
Figure 2:
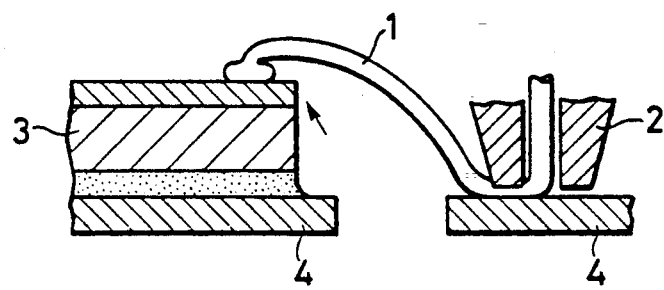
FIG. 2 is a sectional view of a semiconductor device ball-bonded by employing a conventional wire.

Since a wire made of a metal having, in the annealed state, an elongation at room temperature of not more than 60% is remarkably highly work-hardened in the worked state, it is difficult to destroy the oxide film formed on the surface of the ball in the above-described thermal contact bonding or ultrasonic bonding, so that bonding is difficult. Moreover, since a portion of the wire in the vicinity of the bonding portion is softened by heating during bonding as heretofore described, especially local deformation is large. It has been discovered that it is necessary to anneal the wire made of a metal having such an elongation so that the wire becomes softer. Annealing permits the wire itself to be softened throughout, so that there is no possibility of local deformation and, consequently, such problems as breakage are avoided.

It is preferable to emply a wire that has a specific resistance at room temperatures of not more than 15 $\mu\Omega$cm and that is formed of a metal selected from the group consisting of Al, Cu, Ag, Ni, Mo, Pd, Pt, Zr, Ti, Nb and Th. Particularly preferable is a wire formed of AI, Ni, Cu, Pd or Ag. In this specification Al wire and Cu wire are used to mean pure Al and Cu materials and Al alloys and Cu alloys.

The bonding of the present invention includes the ball bonding and wedge bonding techniques and is effected by ultrasonic bonding or thermal contact bonding. Ball bonding is preferable and is effective in case of a semiconductor element being used as a circuit element, because of the limited bonding distance and there is no necessity of turning the semiconductor devices. On the other hand, in case of an external terminal, wedge bonding which is highly efficient, is preferable. In ball bonding, a ball is formed through the tension of the wire itself by fusing the end of the wire held by a capillary on heating by means of arc discharge, hydrogen flames, plasma arc, laser beams or the like. Particularly preferable is a forming method by arc discharge between the wire as a cathode, thereby a clean ball having no oxide film on its surface is formed and, moreover, the ball has no eccentricity. In addition, it is possible to supply a pulse current of at least one of positive pulses and negative pulses in the arc discharge. The pulse current permits control of a proper arc-generating time necessary for formation of a ball. In the case of supplying a current of positive and negative pulses, control can be effected by converting the time required for cleaning and the time required for formation of a ball into a time ratio between positive and negative pulses. The time required for cleaning accounts for just a small percentage of the discharge time (i.e., 10-30% of the discharge time).

It is preferable that the heating-fusing atmosphere used in the ball formation is a non-oxidizing atmosphere. Particularly preferable is an inert gas including a small amount, preferably 5-15 vol. %, of a reducing gas (e.g., hydrogen gas). The atmosphere including such a reducing gas is preferable for a metal having a high affinity to oxygen, such as Al, Ti, Nb, Zr or the like. Especially, for Al, it is preferable to employ an atmosphere including 5-15 vol. % hydrogen gas.

Although any ball diameter is basically available, a preferable ball diameter is 1.5-4 times, particularly 2.5-3.5 times, as large as the wire diameter.

A preferable wire diameter is 20-100 $\mu$m, although it differs according to the kind of metal. For example, the Al wire diameter is about 50 $\mu$m, while the Cu wire diameter is about 30 $\mu$m. The wire diameter is selected in consideration of the specific resistance and like properties of the wire.

A preferable annealing temperature is higher than the recrystallizing temperature of a metal, although this temperature differs according to the kind of metal. It is particularly preferable to full-anneal the wire at a temperature where the wire is substantially full-annealed to such an extent that it is not elastically deformed. It is preferable that the wire is softened so as to have the same hardness throughout, since if the wire locally has a difference in hardness, a local deformation is produced, as described above. For example, preferable annealing temperatures are 150°-400° C. for Al, 400°-600° C. for Cu, 650°-800° C. for Ni, 250°-400° C. for Ag, 400°-1100° C. for Ti, 1000°-1100° C. for Mo, and 800°-1000° C. for Pd and Pt.

Although it is possible to anneal a wire remaining in the worked state when the wire is bonded to a circuit element, it is far more efficient to bond a wire that has been previously full-annealed.

The wire, after being bonded to a circuit element, is cut in the vicinity of the bonding portion of the circuit element by pulling the wire being held by a capillary.

Since the wire has an extremely small diameter as well as is soft, as described above, in order to protect the same, the semiconductor element, the wire and a part of the external terminal are covered with resin. In case of resin, liquid resin is cast or molded and hardened, while a ceramic is cap-seal-bonded by a conventional method.

The encapsulating resins include epoxy resins, phenol resins, polyester resins, etc. They are frequently used together with suitable inorganic or organic fillers.

The present invention is directed to a bonding wire made of a metal having, in the annealed state, an elongation at room temperature of more than 60% and to a wire which has been previously annealed.

The wire, according to the present invention, has characteristics especially preferable as a ball bonding wire.

It is necessary to carry out annealing in a non-oxidizing atmosphere at a temperature higher than the recrystallizing temperature. It is particularly preferable to perform a full annealing to such an extent that no elastic deformation takes place.

Figure 4:
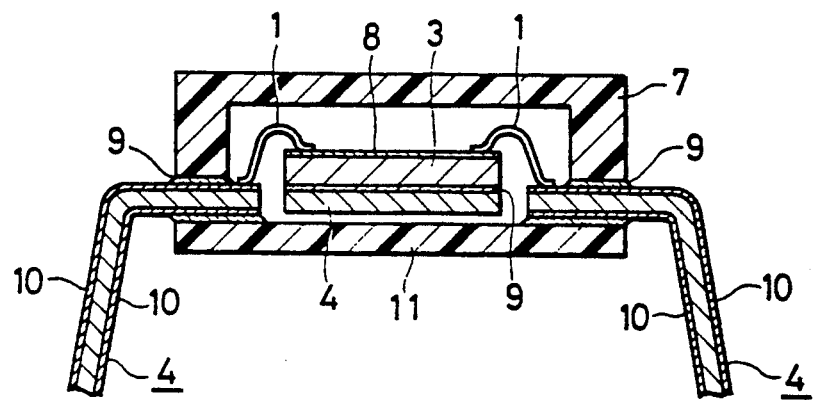
FIG. 4 is a sectional view of a ceramic package type semiconductor device wedge-bonded by employing a wire according to the present invention.

FIG. 4 is a sectional view of a ceramic package-type semiconductor device to which an annealed Cu wire 1, according to the present invention, is applied. The Cu wire, which has a diameter of 30 $\mu$m, was subjected to a full annealing of one hour heating at 400° C. in argon gas. The bonding was effected by means of ultrasonic bonding with a conventional wedge bonder. As shown in FIG. 4, it has been proved that, according to the present invention, not only bonding itself is extremely easy since the wire is soft, but also the wire can be bonded in a desired loop shape since the wire is soft throughout. The reference numeral 4 designates a Cu lead frame plated with Ag 10; 8 designates an electrode made of an Al deposited film formed on the surface of a semiconductor element 3; 7 and 11 designate ceramic bases, respectively; and 9 designates a low-melting glass.

As shown in FIG. 4, since the semiconductor element, according to the present invention, has no local deformation of the bonding wire, and since a desired loop shape can be obtained even if there is a difference in level between the element 3 and the lead frame 4, there is no possibility that the wire short-circuits with the element.

As can be seen from FIG. 4, wires 1 are free in the ceramic package 7, 11. Therefore, a large mechanical stress is not applied to the wire.

EXAMPLE

Figure 5:
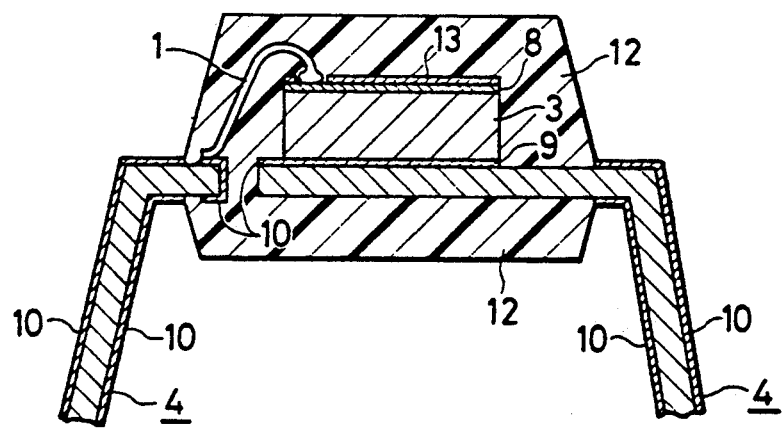
FIG. 5 is a sectional view of a resin molded type semiconductor device ball-bonded by employing a wire according to the present invention.

FIG. 5 is a sectional view of a resin-encapsulated type semiconductor device (molded with a conventional epoxy resin composition) to which an annealed Al wire 1, according to the present invention, is applied. The Al wire was subjected to a full annealing of one hour heating at 250° C. in a $N_2$ gas. The Al wire 1 is ball-bonded to the semiconductor element 3 provided with the Al deposited film 8, while the wire is wedge-bonded to the lead frame 4 provided with the Ag or Ni deposited layer 10. After ball bonding, a protective film 13, such as $SiO_2$ or the like, is provided on the semiconductor element. Then, a thermosetting resin composition is transfer-molded to form the semiconductor device shown in this figure.

Figure 3A:
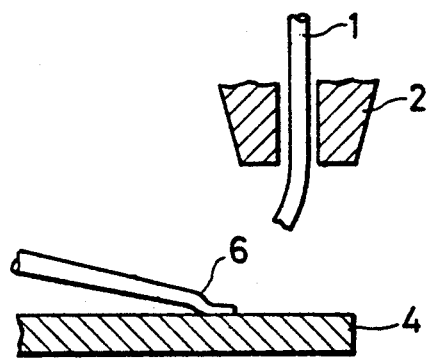
FIG. 3(*a*) and FIG. 3(*b*) are sectional views showing, respectively, how, after wedge bonding, a ball is formed through arc discharge by employing a conventional wire.
Figure 3B:
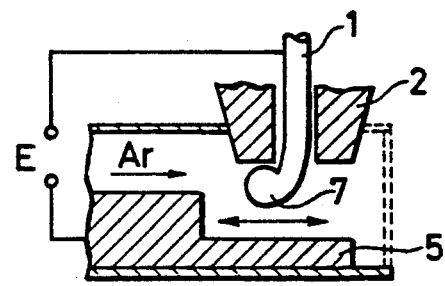

The bonding is effected in such a way that the Al wire is extruded or drawn through a capillary 2 as shown in FIG. 3(b) and bonded is by means of arc discharge. The above-described Al wire was subjected to discharge under discharge conditions of a discharge voltage of 1,000 V, discharge current 10 mA–10 A and discharge time of 0.01 to 30 m.s, particularly 0.1 to 0.4 m.s in an atmosphere replaced, after evacuation, with an Ar gas atmosphere including 7% (volume) hydrogen in order to form a ball at its end. The discharge was effected by moving a W electrode 5 to the wire. The time for bonding was controlled by means of the moving speed of the electrode. Moreover, the energization was performed by means of a current of positive pulses and negative pulses, with the energization made lesser on the side of cleaning the wire. The obtained ball was ultrasonic-bonded to the semiconductor element by means of the capillary 2, and then the other end was similarly ultrasonic-bonded to the lead frame 4.

Although the ball obtained, according to the method, was formed into an oval slightly longer in the axial direction of the wire, the ball was close to an excellent sphere. It has been confirmed that the ball is substantially equal in hardness to the wire itself, and it is possible to provide a fine loop-shaped wire bonding without any local deformation in the vicinity of the ball, as shown in the figure. In addition, although the cutting of the wire after wedge bonding is effected by lifting the capillary in order to pull the wire, the cutting was extremely easy because the wire was soft and, moreover, the pulling did not cause such problems at all as exfoliation of the bonding portion.

Since the semiconductor device, according to the present invention, has no local deformation of the wire in ball bonding and, consequently, a desired loop can be obtained, there was no possibility of disconnection due to a local deformation and, moreover, there was no accident such as the short-circuit of the wire with the element.

PRODUCTION EXAMPLE OF CU WIRE

A ball was formed at the end of a Cu wire having a diameter of 30 μm and remaining, in the worked state and at the end of a wire obtained by subjecting such a Cu wire to a full annealing of one hour heating at 400° C. in Ar gas, by the method illustrated in FIG. 3(b).

The arc discharge was effected under a voltage of 1000 V, a current of 10–20 mA and Ar gas. The discharge time was controlled by means of the moving speed of the W electrode 5 and the pulse frequency, as described above.

In a similar manner to the above, a ball was formed at the end of an Al wire having a diameter of 50 μm and remaining in the worked state and an Al wire obtained by subjecting such a worked wire to a full annealing of one hour heating at 250° C. The discharge conditions were substantially the same for the Cu wires, except that a discharge current was 1 to 10A.

Figure 6:
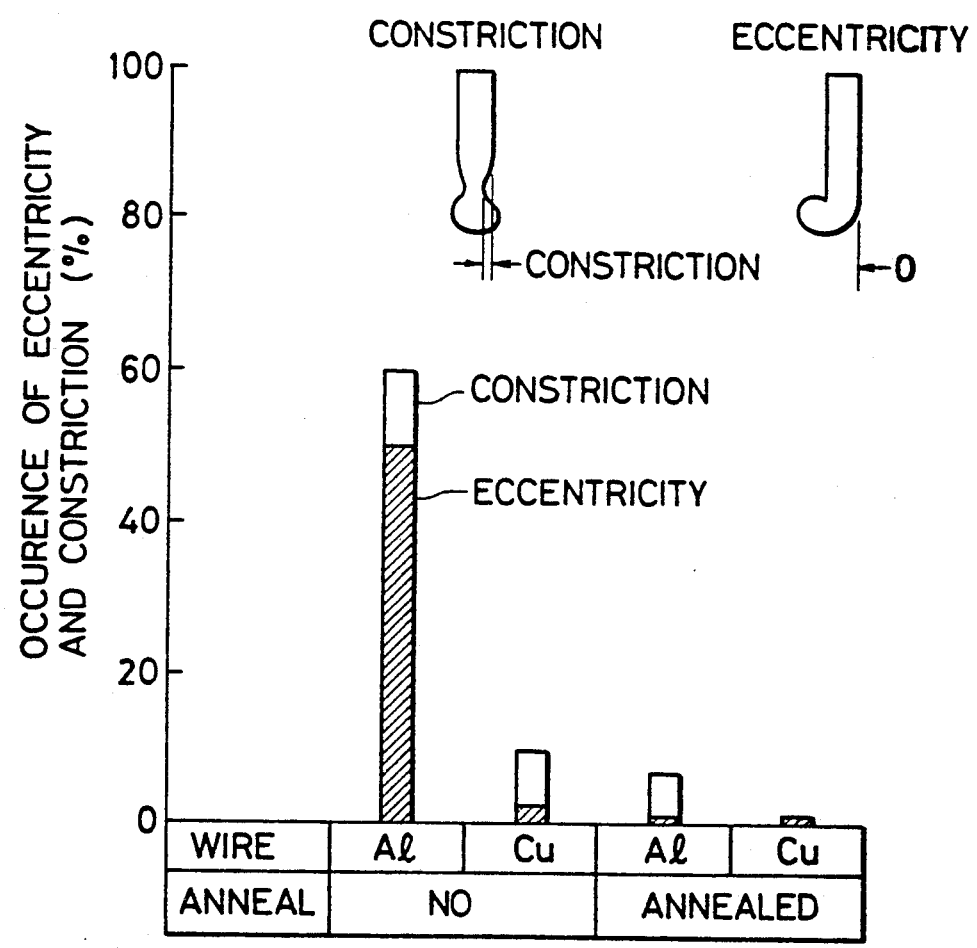
FIG. 6 is a bar graph showing the relation between the conventional wires as well as wires according to the present invention as to the percentage of production of eccentricity on one hand and the percentage of production of eccentricity and constriction, on the other.

For each of the Cu and Al wires, 50 balls were formed, and the number of the balls having constrictions and eccentricity was examined and then the percentage thereof was obtained. The results are shown in FIG. 6.

As shown in this figure, it has been made known that the A wire remaining in the worked state produces constriction 60% of the time and eccentricity 50% of the time while the annealed Al wire produces constriction only for 7% of the balls and eccentricity in balls on the order of several %; i.e., about 3%, and forms a round ball symmetrical with respect to the wire axis. Moreover, although the Cu wire is more excellent than the Al wire even when the Cu wire remains in the worked state, the annealed Cu wire hardly produced any constriction and eccentricity.

The formation of the ball was examined for the above-described annealed Al wire in a similar manner to the above, with the gas atmosphere changed. As the gas atmosphere, Ar was mixed with the $H_2$ gas up to 50 vol. %, and the relation between the mixing percentage and the ball-forming state was examined. As a result, the ball-forming state was most excellent when the $H_2$ quantity was 5–15 vol. %. In this case, energization was effected also by making the wire positive or negative besides the pulse current of 5A and a discharge time of 0.4 m.s. As a result, with the energization by the pulse current, it was easy to control the size of the ball diameter and, moreover, it allowed a clean ball to be obtained.

Balls were formed through arc discharge similarly by making the wire negative by the method shown in FIG. 3(b) in an Ar gas atmosphere, using wires of Ag with a diameter 30 μm, Ni with a diameter 50 μm, Pd with a diameter 50 μm, Ti with a diameter of 50 μm, and Pt with a diameter 50 μm, after carrying out annealing in the Ar gas for one hour at 300° C. for Ag, 700° C. for Ni, and 900° C. for Pd, Pt and Ti. As the result of forming balls with the discharge, current and time changed according to the kind of metal; it has been confirmed that, since all the wires have no elastic deformation, there is no possibility of extrusion of a curved wire as shown in FIG. 3(b), so that extremely excellent balls are formed.

As described above, according to the present invention, such excellent effects can be obtained that it is possible to obtain a wire bonding having no local deformation at the bonding portion of the wire.

What is claimed is:

1. A wire having a ball at a tip thereof for use in integrated circuits encapsulated in a resin, said metal wire having a diameter of 20 to 100 μm, said metal wire being made of Cu consisting essentially of copper, the entire length of said metal wire being annealed and said ball of said metal wire being a sphere in shape and having a hardness substantially equal to that of said metal wire.

2. A wire having a ball at a tip thereof for use in integrated circuits encapsulated in a resin, said metal wire having a diameter of 20 to 100 μm, said metal wire being made of Cu consisting essentially of copper, the entire length of said metal wire being annealed in a non-oxidizing atmosphere, and said ball of said metal wire being a sphere in shape and having a hardness substantially equal to that of said metal wire, and said metal wire has a specific resistance of not more than 15 $\mu\Omega$ cm at room temperature.

3. A wire having a ball at a tip thereof for use in integrated circuits encapsulated in a resin according to claim 1, wherein said ball of said metal wire is formed by fusing an end of said metal wire by means of arc discharge, hydrogen flames, plasma arc, or laser beams.

4. A wire having a ball at a tip thereof for use in integrated circuits encapsulated in a resin according to claim 1, wherein a heat-fusing atmosphere used in formation of said ball of said metal wire is a non-oxidizing atmosphere.

5. A wire having a ball at a tip thereof for use in integrated circuits encapsulated in a resin according to claim 4, wherein the non-oxidizing atmosphere is an inert gas.

6. A wire having a ball at a tip thereof for use in integrated circuits encapsulated in a resin according to claim 5, wherein the inert gas includes preferably 5–15 vol. % of hydrogen gas.

7. A wire having a ball at a tip thereof for use in integrated circuits encapsulated in a resin, said metal wire having a diameter of 20 to 100 $\mu$m, said metal wire being made of Cu consisting essentially of copper, the entire length of said metal wire being annealed in a non-oxidizing atmosphere, and said ball of said metal wire being a sphere in shape and having a hardness substantially equal to that of said metal wire, and said metal wire is annealed, and after annealing said ball is formed on said metal wire.

8. A wire having a ball at a tip thereof for use in integrated circuits encapsulated in a resin, said metal wire having a diameter of 20 to 100 $\mu$m, said metal wire being made of Cu consisting essentially of copper, the entire length of said metal wire being annealed in a non-oxidizing atmosphere, and said ball of said metal wire being a sphere in shape and having a hardness substantially equal to that of said metal wire, and a diameter of said ball of said metal wire is 1.5 to 4 times that of said metal wire.

9. A wire having a ball at a tip thereof for use in integrated circuits encapsulated in a resin, said metal wire having a diameter of 20 to 100 $\mu$m, said metal wire being made of Cu consisting essentially of copper, the entire length of said metal wire being annealed in a non-oxidizing atmosphere, and said ball of said metal wire being a sphere in shape and having a hardness substantially equal to that of said metal wire, and a diameter of said ball of said metal wire is 2.5 to 3.5 times that of said metal wire.

10. A resin encapsulated semiconductor device which comprises:
(a) at least one semiconductor element having a metal film formed thereon;
(b) a lead frame bonded to said semiconductor element;
(c) metal wires of a specific resistance of not more than 15 $\mu\Omega$ cm at room temperature, each of said metal wires having a diameter of 20 to 100 $\mu$m and a ball at one end thereof, each of said balls being electrically connected to said semiconductor element through said metal film and the other ends of said metal wires being connected to said lead frame; and
(d) an encapsulation of a resin material encapsulating said semiconductor element, said metal wires and at least a part of said lead frame;
wherein the entire length of said metal wire, which is made of Cu consisting essentially of copper, is annealed and said metal wire and said ball have substantially the same hardness.

11. A resin encapsulated semiconductor device which comprises:
(a) at least one semiconductor element having a metal film formed thereon;
(b) a lead frame bonded to said semiconductor element;
(c) metal wires each having a diameter of 20 to 100 $\mu$m and a ball at one end thereof, each of said balls being electrically connected to said semiconductor element through said metal film and the other ends of said metal wires being connected to said lead frame; and
(d) an encapsulation of a resin material encapsulating said semiconductor element, said metal wires and at least a part of said lead frame;
wherein the entire length of said metal wire, which is made of Cu consisting essentially of copper, is annealed at 400° to 600° C. so that said metal wire and said ball have substantially the same hardness.

12. A resin encapsulated semiconductor device which comprises:
(a) at least one semiconductor element having an aluminum film formed thereon;
(b) a lead frame bonded to said semiconductor element;
(c) metal wires of a specific resistance of not more than 15 $\mu\Omega$ cm at room temperature, each of said metal wires having a diameter of 20 to 100 $\mu$m and a ball at one end thereof, each of said balls being electrically connected to said semiconductor element through said aluminum film and the other ends of said metal wires being connected to said lead frame; and
(d) an encapsulation of a resin material encapsulating said semiconductor element, said metal wires and at least a part of said lead frame;
wherein the entire length of said metal wire, which is made of Cu consisting essentially of copper, is annealed and said metal wire and said ball have substantially the same hardness.

13. A resin encapsulated semiconductor device which comprises:
(a) at least one semiconductor element having an aluminum film formed thereon;
(b) a lead frame bonded to said semiconductor element;
(c) metal wires each having a diameter of 20 to 100 $\mu$m and a ball formed by fusion of said metal wire at one end thereof, each of said balls being electrically connected to said semiconductor element through said aluminum film and the other ends of said metal wires being connected to said lead frame by bonding; and
(d) an encapsulation of a resin material encapsulating said semiconductor element, said metal wires and at least a part of said lead frame;
wherein the entire length of said metal wire, which is made of Cu consisting essentially of copper, is annealed and said metal wire and said ball have substantially the same hardness.

14. A resin encapsulated semiconductor device which comprises:
  (a) at least one semiconductor element having an aluminum film formed thereon;
  (b) a lead frame bonded to said semiconductor element;
  (c) metal wires each having a diameter of 20 to 100 μm and a ball formed by fusion, in a non-oxidizing atmosphere, of said metal wire at one end thereof, each of said balls being electrically connected to said semiconductor element through said aluminum film and the other ends of said metal wires being connected to said lead frame by bonding; and
  (d) an encapsulation of a resin material encapsulating said semiconductor element, said metal wires and at least a part of said lead frame;
wherein the entire length of said metal wire, which is made of Cu consisting essentially of copper, is annealed and said metal wire and said ball have substantially the same hardness.

15. A resin encapsulated semiconductor device according to claim 10, wherein said ball of said metal wire is formed by fusing an end of said metal wire by means of arc discharge, hydrogen flames, plasma arc, or laser beams.

16. A resin encapsulated semiconductor device according to claim 11, wherein said ball of said metal wire is formed by fusing an end of said metal wire by means of arc discharge, hydrogen flames, plasma arc, or laser beams.

17. A resin encapsulated semiconductor device according to claim 12, wherein said ball of said metal wire is formed by fusing an end of said metal wire by means of arc discharge, hydrogen flames, plasma arc, or laser beams.

18. A resin encapsulated semiconductor device according to claim 14, wherein said ball of said metal wire is formed by fusing an end of said metal wire by means of arc discharge, hydrogen flames, plasma arc, or laser beams.

19. A resin encapsulated semiconductor device which comprises:
  (a) at least one semiconductor element having a metal film formed thereon;
  (b) a lead frame bonded to said semiconductor element;
  (c) metal wires of a specific resistance of not more than 15 μΩ cm at room temperature, each of said metal wires having a diameter of 20 to 100 μm, said metal wire is made of Cu consisting essentially of copper, and a ball formed by fusion of said metal wire at one end thereof, each of said balls being electrically connected to said semiconductor element through said metal film and the other ends of said metal wires being connected to said lead frame; and
  (d) means for encapsulating said semiconductor element, said metal wires and at least a part of said lead frame;
wherein the entire length of said metal wire is annealed and said metal wire and said ball have substantially the same hardness.

20. A resin encapsulated semiconductor device which comprises:
  (a) at least one semiconductor element having a metal film formed thereon;
  (b) a lead frame bonded to said semiconductor element;
  (c) metal wires each having a diameter of 20 to 100 μm and a ball formed by fusion of said metal wire at one end thereof, each of said balls being electrically connected to said semiconductor element through said metal film and the other ends of said metal wires being connected to said lead frame; and
  (d) means for encapsulating said semiconductor element, said metal wires and at least a part of said lead frame;
wherein the entire length of said metal wire, which is made of Cu consisting essentially of copper, is annealed at 400° to 600° C. so that said metal wire and said ball have substantially the same hardness.

21. A semiconductor device according to claim 19, wherein after said metal wire is bonded to said semiconductor element and said lead frame, a thermosetting resin material is transfer-molded to form the semiconductor device.

22. A semiconductor device according to claim 20, wherein after said metal wire is bonded to said semiconductor element and said lead frame, a thermosetting resin material is transfer-molded to form the semiconductor device.

* * * * *